(12) United States Patent
Park et al.

(10) Patent No.: US 9,590,197 B2
(45) Date of Patent: Mar. 7, 2017

(54) SUBSTRATE FOR ORGANIC ELECTRONIC DEVICE

(71) Applicant: LG CHEM, LTD., Seoul (KR)

(72) Inventors: Min Choon Park, Daejeon (KR); Jung Ho Jo, Daejeon (KR); Sang Woo Kim, Daejeon (KR); Mi Ra Im, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/498,434

(22) Filed: Sep. 26, 2014

(65) Prior Publication Data

US 2015/0008425 A1 Jan. 8, 2015

Related U.S. Application Data

(63) Continuation of application No. PCT/KR2013/002703, filed on Apr. 1, 2013.

(30) Foreign Application Priority Data

Mar. 30, 2012 (KR) .................. 10-2012-0033511
Jul. 31, 2012 (KR) .................. 10-2012-0084213

(51) Int. Cl.
*H01L 51/50* (2006.01)
*H01L 51/00* (2006.01)
(Continued)

(52) U.S. Cl.
CPC ...... *H01L 51/0096* (2013.01); *C08G 73/1064* (2013.01); *C08G 73/1067* (2013.01);
(Continued)

(58) Field of Classification Search
CPC ............ H01L 51/0096; H01L 51/0035; H01L 51/5268; H01L 51/50
See application file for complete search history.

(56) References Cited

U.S. PATENT DOCUMENTS 5,470,943 A * 11/1995 Sakata ............... C08G 73/1085
528/170
6,924,348 B2 * 8/2005 Tajiri ................ C08G 73/1039
385/123
(Continued)

FOREIGN PATENT DOCUMENTS

CN 1500108 A 5/2004
CN 1554212 A 12/2004
(Continued)

OTHER PUBLICATIONS

Fukuzaki et al., "Synthesis and Chcaracterization of Highly Refractive Polyimides Derived from Thiophene-Containing Aromatic Diamines and Aromatic Dianhydrides", Macromolecules (2010): pp. 1836-1843.*
(Continued)

*Primary Examiner* — Michele Fan
(74) *Attorney, Agent, or Firm* — Dentons US LLP

(57) ABSTRACT

Provided are a substrate for an organic electronic device (OED), an OED, and lighting. The substrate capable of forming an OED may have excellent performances including light extraction efficiency and prevent penetration of moisture or a gas from an external environment, and thus an OED having excellent performance and durability may be provided.

15 Claims, 8 Drawing Sheets

(51) Int. Cl.
*C09D 179/08* (2006.01)
*C08G 73/10* (2006.01)
*H01L 51/52* (2006.01)

(52) U.S. Cl.
CPC ........ *C09D 179/08* (2013.01); *H01L 51/0035* (2013.01); *H01L 51/5268* (2013.01); *H01L 51/5275* (2013.01); *H01L 51/50* (2013.01); *H01L 2251/5369* (2013.01); *Y02E 10/549* (2013.01)

(56) References Cited

U.S. PATENT DOCUMENTS

| | | | |
|---|---|---|---|
| 2003/0127973 A1 | 7/2003 | Weaver et al. | |
| 2004/0092127 A1* | 5/2004 | Kurosawa | H01L 21/764 438/736 |
| 2008/0252980 A1* | 10/2008 | Hebrink | B29D 11/00798 359/599 |
| 2008/0272689 A1 | 11/2008 | Ide et al. | |
| 2009/0230841 A1* | 9/2009 | Boerner | H01L 51/5268 313/504 |
| 2010/0026934 A1* | 2/2010 | Sun | G02F 1/133606 349/74 |
| 2010/0194717 A1* | 8/2010 | Mori | H01L 51/5268 345/204 |
| 2011/0024779 A1 | 2/2011 | Nakamura et al. | |
| 2012/0037405 A1* | 2/2012 | Hamazawa | H05K 1/0393 174/254 |
| 2013/0105770 A1* | 5/2013 | Pschenitzka | H01L 31/0232 257/40 |

FOREIGN PATENT DOCUMENTS

| | | |
|---|---|---|
| CN | 101790899 A | 7/2010 |
| CN | 102257649 A | 11/2011 |
| CN | 102317862 A | 1/2012 |
| EP | 1435762 A1 | 7/2004 |
| EP | 2203030 A1 | 6/2010 |
| EP | 2 557 896 | 2/2013 |
| JP | 63-244687 A | 10/1988 |
| JP | 2003332068 A * | 11/2003 |
| JP | 2005-190931 A | 7/2005 |
| JP | 2006100042 A * | 4/2006 |
| JP | 2007-066886 A | 3/2007 |
| JP | 2007-335253 | 12/2007 |
| JP | 2008-230018 A | 10/2008 |
| JP | 2009-076452 A | 4/2009 |
| JP | 2010-182449 A | 8/2010 |
| KR | 10-2005-0038109 | 4/2005 |
| KR | 10-2010-0063729 | 6/2010 |
| KR | 10-2011-0023814 | 3/2011 |
| TW | 201120569 | 6/2011 |
| TW | 201203649 | 1/2012 |
| WO | 2011-126097 | 10/2011 |
| WO | 2012-018121 A1 | 2/2012 |
| WO | 2012/029536 A1 | 3/2012 |

OTHER PUBLICATIONS

Shinji et al., "Wavelength Dependence of Refractive Indices of Polyimides in Visible and Near-IR Regions", Jpn. J. Appl. Phys., 41(2002): pp. 5254-5258.*

* cited by examiner

SUBSTRATE FOR ORGANIC ELECTRONIC DEVICE

This application is a Continuation Bypass of International Application No. PCT/KR2013/002703, filed Apr. 1, 2013, and claims the benefit of Korean Application No. 10-2012-0033511, filed on Mar. 30, 2012, and Korean Application No. 10-2012-0084213, filed on Jul. 31, 2012, all of which are hereby incorporated by reference in their entirety for all purposes as if fully set forth herein.

FIELD

The present application relates to a substrate for an organic electronic device (OED), and an OED.

BACKGROUND

An OED is a device exhibiting various functions through exchange of charges between an electrode layer and an organic material, which includes an organic light emitting device (OLED), an organic solar cell, an organic photo conductor (OPC), and an organic transistor.

An OLED, which is a representative OED, conventionally includes a substrate, a first electrode layer, an organic layer including an emitting layer and a second electrode layer, which are sequentially stacked.

In the structure, which is, so called, a bottom emitting device, the first electrode layer may be a transparent electrode layer, and the second electrode layer may be a reflective electrode layer. In addition, in the structure, which is, so called, a top emitting device, the first electrode layer may be a reflective electrode layer, and the second electrode layer may be a transparent electrode layer.

Electrons and holes are injected respectively by the two electrode layers, and the injected electrons and holes are recombined in the emitting layer, resulting in generating light. The light may be emitted to the substrate in the bottom emitting device, and to the second electrode layer in the top emitting device.

In the structure of the OLED, indium tin oxide (ITO) generally used as the transparent electrode layer, the organic layer and the substrate, which is conventionally formed of glass, have refractive indexes of approximately 2.0, 1.8 and 1.5, respectively. In such a relationship of the refractive index, for example, the light generated in the organic emitting layer in the bottom emitting device is trapped at an interface between the organic layer and the first electrode layer or in the substrate due to a total internal reflection phenomenon, and only a very small amount of light is emitted.

DESCRIPTION

Object

The present application is directed to providing a substrate for an OED, and an OED.

Solution

One aspect of the present application provides a substrate for an OED, including: a base layer and a scattering layer. The scattering layer may be formed, for example, on the base layer. FIG. 1 shows an illustrative substrate 100 including a base layer 101 and a scattering layer 102 formed thereon.

As the base layer, a suitable material may be used without particular limitation. For example, to manufacture a bottom emitting OLED, as a transparent base layer, a base layer having a transmittance of 50% or more with respect to visible light may be used. As the transparent base layer, a glass base layer or a transparent polymer base layer may be used. As the glass base layer, a base layer including soda lime glass, barium/strontium-containing glass, lead glass, alumino silicate glass, borosilicate glass, barium borosilicate glass or quartz may be used, and as the polymer base layer, a base layer including polyimide (PI), polyethylene naphthalate (PEN), polycarbonate (PC), an acrylic resin, poly(ethylene terephthalate) (PET), poly(ether sulfide) (PES) or polysulfone (PS) may be used, but the present application is not limited thereto. In addition, as needed, the base layer may be a TFT substrate having a drive TFT.

For example, to provide a top emitting device, the base layer does not need to be a transparent base layer. In this case, as needed, a reflective base layer having a reflective layer which is formed of aluminum on a surface of the base layer may be used.

The scattering layer may include, for example, a binder and scattering particles. For example, the scattering layer may be formed using a composition prepared by mixing the binder and the scattering particles. Due to the scattering layer, for example, when an OLED is formed on the substrate, light extraction efficiency may be enhanced. FIG. 2 shows an illustrative scattering layer 102, which includes a binder 201 and scattering particles 202.

As the binder, a known material may be used without particular limitation, but poly(amic acid) or polyimide, preferably, poly(amic acid) may be used in terms of increasing efficiency of forming a monolayer of the scattering particles by enhancing dispersibility of the scattering particles.

As the poly(amic acid) or polyimide binder, for example, a binder having a refractive index of, for example, approximately 1.5, 1.6, 1.65 or 1.7 or more with respect to light having a wavelength of 633 nm may be used. Such highly refractive poly(amic acid) or polyimide may be prepared, for example, using a monomer to which a halogen atom other than fluorine, a sulfur atom or a phosphorus atom is introduced.

The binder may be, for example, poly(amic acid) which has a part capable of binding to the particles to enhance dispersion stability of the particles may be used. The poly(amic acid) may be a compound including a repeating unit of Formula 1.

[Formula 1]

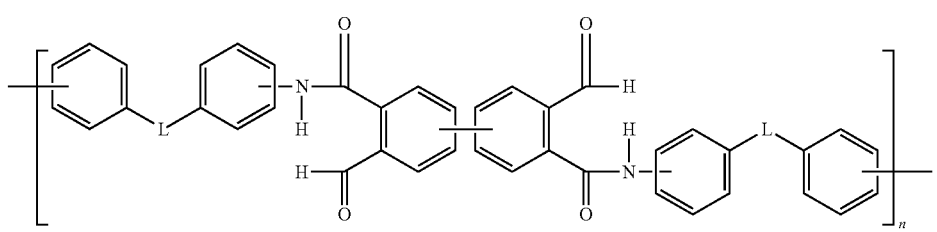

In FIG. 1, L is —S—, —S(=O)—, —S(=O)$_2$— or —S—S—, and n is a positive number. In FIG. 1, a specific range of n may be, but is not particularly limited, suitably selected within a range satisfying a weight average molecular weight which will be described later.

The repeating unit may be arbitrary substituted by at least one substituent. As the substituent, a functional group including a halogen atom other than fluorine, a phenyl group, a benzyl group, a naphthyl group, a thiophenyl group, a sulfur atom or a phosphorus atom may be used.

A terminal end of the poly(amic acid) having the repeating unit of Formula 1 may be blocked with an alkyl group, for example, an alkyl group having 1 to 20, 1 to 8, or 1 to 4 carbon atoms.

The poly(amic acid) may be a homopolymer formed only with the repeating unit of Formula 1, or a copolymer including the repeating unit of Formula 1 and another unit. In the case of the copolymer, the kind or ratio of another repeating unit may be suitably selected in the range in which a desired refractive index, thermal resistance or light transmittance is not inhibited.

A specific example of the repeating unit of Formula 1 may be a repeating unit of Formula 2.

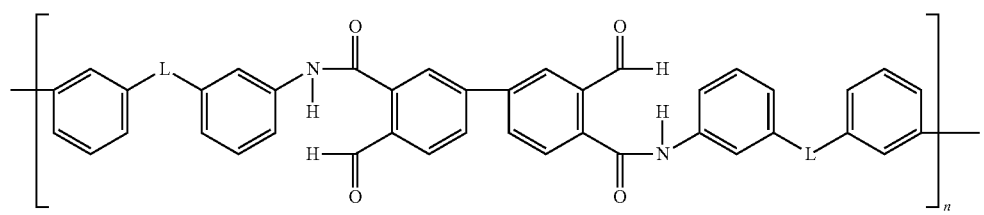

[Formula 2]

In Formula 2, L is —S—, —S(=O)—, —S(=O)$_2$— or —S—S—, and n is a positive number. In Formula 2, a specific range of n may be suitably selected in the range satisfying a weight average molecular weight which will be described later without particular limitation.

The poly(amic acid) may have, for example, a weight average molecular weight converted with standard polystyrene measured by gel permeation chromatography (GPC) of approximately 10,000 to 100,0000 or 10,000 to 50,000. In addition, the poly(amic acid) having the repeating unit of Formula 1 has a light transmittance of 80, 85, or 90% or more in the visible region, and have excellent thermal resistance.

When necessary, the binder may consequently include the poly(amic acid) and the polyimide, and in this case, a ratio of the both components is not particularly limited.

The scattering layer may include scattering particles along with the binder. The scattering particles may be formed, for example, in a monolayer in the scattering layer.

The term "scattering particles" used herein may refer to, for example, particles capable of scattering incident light since it has a refractive index different from that of the binder for forming the scattering layer or a planarized layer to be described later, and a suitable size. As such particles, for example, particles having a higher or lower refractive index than that of the binder within a range of the refractive index of, for example, approximately 0.5 to 4.0 may be used. The scattering particles may have a refractive index of, for example, approximately 1.0 to 2.0, 1.2 to 1.8, 2.1 to 3.5 or 2.2 to 3.0, and an average diameter of approximately 100 nm or more, 100 to 20,000 nm, 100 to 5,000 nm, 100 to 3,000 nm, 100 to 1,000 nm or 100 to 500 nm. The scattering particles may have a spherical, oval, polygonal or amorphous shape, but the shape thereof is not particularly limited thereto. The scattering particles may include, for example, an organic material such as polystyrene or a derivative thereof, an acrylic resin or a derivative thereof, a silicon resin or a derivative thereof, or a novolac resin or a derivative thereof, or an inorganic material such as silica, alumina, titanium oxide or zirconium oxide. The scattering particles may include any one of the above materials, or at least two thereof, or may be formed in core/shell-type particles or hollow-type particles as needed.

A ratio of the scattering particles in the scattering layer is not particularly limited, and may be suitably selected in consideration of, for example, desired scattering or dispersion efficiency or possibility of forming the monolayer.

The scattering layer may be formed by, for example, a wet coating method including the binder and the scattering particles, a sol-gel method, a deposition method such as chemical vapor deposition (CVD) or physical vapor deposition (PVD), or a microembossing method.

The substrate may further include a planarized layer. As shown in FIG. 3, for example, the planarized layer 301 may be formed on the top of the scattering layer 102, and thereby included in the substrate 300. The term "planarized layer" may refer to a layer capable of providing a planarized surface on which an OED may be formed. For example, the planarized layer may provide a surface having a maximum height roughness of 1 μm or less or 0.5 μm. The maximum height roughness may refer to a distance between a straight line passing the maximum point of the roughness curve and a straight line passing the minimum point thereof, which is parallel to a central line in a roughness curve within a cut off. The maximum height roughness may be, for example, a value measured with respect to an optional region having an area of 100 μm$^2$ on the planarized surface.

The planarized layer may include, for example, a binder and particles. For example, the planarized layer may be formed using a composition prepared by mixing particles having a highly refractive index such that a refractive index of the planarized layer may be increased with a binder. As described above, the planarized layer may provide a surface on which an OED including an electrode layer is formed. In addition, the planarized layer may embody excellent light extraction efficiency through interaction with a scattering layer to be described later in some cases. For example, the planarized layer may have the same refractive index as that of an adjacent electrode layer, which may be, for example, approximately 1.8 to 3.5 or 2.2 to 3.0. The term "refractive index" used herein may be, unless particularly defined otherwise, a refractive index with respect to light having a wavelength of 400 to 450 nm in a vacuum state.

As the binder forming a planarized layer, a known material may be used without particular limitation. The binder may be, for example, one of various organic binders, inorganic binders and organic/inorganic binders, which are known in the art. When necessary, a binder having a refractive index of approximately 1.4 or 1.45 or more may be used. The upper limit of the refractive index of the binder may be selected in the range capable of satisfying the above-described refractive index of the planarized layer in consideration of a refractive index of the particles to be blended therewith. In consideration of a life span of the device or excellent resistance to a high temperature process, photo process or etching process performed in the manufacturing process, an inorganic or organic/inorganic binder having excellent thermal resistance and chemical resistance may be used, but an organic binder may also be used when necessary. The binder may be, for example, a heat or photo curable monomeric, oligomeric or polymeric organic material including polyimide, a caldo resin having a fluorine ring, urethane, epoxide, polyester or acrylate, an inorganic material such as silicon oxide, silicon nitride, silicon oxynitride or polysiloxane, or an organic/inorganic combination material.

For example, as the binder, polysiloxane, poly(amic acid) or polyimide may be used. The polysiloxane may be formed by polycondensating, for example, a condensable silane compound or siloxane oligomer, and the binder may form a matrix based on a bond (Si—O) between silicon and oxygen. During the formation of the binder, the binder matrix based on the bond (Si—O) between silicon and oxygen may be formed by controlling condensation conditions during the formation of the binder, or a matrix in which some of organic groups such as an alkyl group or condensable functional groups such as an alkoxy group remain may be formed.

As the polyamic or polyimide binder, for example, a binder having a refractive index of approximately 1.5, 1.6, 1.65 or 1.7 or more with respect to light having a wavelength of 633 nm may be used. The poly(amic acid) or polyimide binder may be, for example, a polymer used in the above-described scattering layer.

The planarized layer may include the binder and highly refractive particles, for example, having a refractive index of 2.5, 2.6 or 2.7 or more. The upper limit of the refractive index of the particles may be selected in the range capable of satisfying the above-described refractive index of the planarized layer in consideration of, for example, the refractive index of the binder blended therewith. The particles may have an average diameter of, for example, approximately 1 to 100 nm, 1 to 90 nm, 20 to 80 nm, 30 to 70 nm, 30 to 60 nm or 30 to 50 nm. As the highly refractive particles, for example, a rutile-type titanium oxide may be used, but one of various particles satisfying the range of the refractive index may also be used.

The planarized layer may include the particles at 300, 250 or 200 parts by weight or less relative to 100 parts by weight of the binder. The lower limit of the ratio of the particles may be, for example, 40, 60, 80 or 100 parts by weight or more. Unless particularly defined otherwise, the unit "parts by weight" used herein refers to a ratio of weights between components. When an OED is formed by maintaining a ratio between the binder and the particles as described above, the device having excellent performance and reliability may be provided by increasing external quantum efficiency, preventing penetration of a gas or moisture from an external environment, and reducing outgassing.

In another example, the planarized layer may be formed using a material prepared by blending a compound such as an alkoxide or acylate of a metal such as zirconium, titanium or cerium with a binder having a polar group such as a carboxyl group or a hydroxyl group. The compound such as an alkoxide or acrylate may be condensed with the polar group of the binder, and provide the metal to a backbone of the binder, thereby embodying a highly refractive index. Examples of the alkoxide or acrylate compound may include a titanium alkoxide such as tetra-n-butoxy titanium, tetraisopropoxy titanium, tetra-n-propoxy titanium or tetraethoxy titanium, a titanium acylate such as titanium stearate, a titanium chelate, a zirconium alkoxide such as tetra-n-butoxy zirconium, tetra-n-propoxy zirconium, tetraisopropoxy zirconium or tetraethoxy zirconium, a zirconium acylate such as zirconium tributoxystearate, or a zirconium chelate.

In addition, the planarized layer may be formed by preparing a coating solution by blending a metal alkoxide such as titanium alkoxide or zirconium alkoxide with a solvent such as an alcohol or water, coating the coating solution, and plasticizing the coated solution at a suitable temperature by sol-gel coating.

A thickness of the planarized layer is not particularly limited, and may be controlled within a suitable range as needed.

The substrate may further include an electrode layer. For example, the electrode layer may be formed on the top of the scattering layer or the planarized layer. As the electrode layer, for example, a conventional hole injection or electron injection electrode layer used to manufacture an OED such as an OLED may be formed.

The hole injection electrode layer may be formed using, for example, a material having a relatively high work function, and when necessary, using a transparent material. For example, the hole injection electrode layer may include a metal, alloy, electric conductive compound having a work function of approximately 4.0 eV or more, or a mixture of at least two thereof. Such a material may be a metal such as gold, CuI, ITO, indium zinc oxide (IZO), zinc tin oxide (ZTO), aluminum or indium-doped zinc oxide, magnesium indium oxide or nickel tungsten oxide, an oxide material such as ZnO, $SnO_2$ or $In_2O_3$, a metal nitride such as gallium nitride, a metal selenide such as zinc selenide, or a metal sulfide such as zinc sulfide. A transparent hole injection electrode layer may also be formed using a stacked structure of a metal thin film such as Au, Ag or Cu and a highly refractive transparent material such as ZnS, $TiO_2$ or ITO.

The hole injection electrode layer may be formed by an optional means such as deposition, sputtering, chemical deposition or electrochemical means. In addition, as needed, the formed electrode layer may be patterned through a known process such as photolithography or a shadow mask. A thickness of the hole injection electrode layer may vary depending on light transmittance or surface resistance, and may be conventionally within a range of 500 nm or 10 to 200 nm.

An electron injection transparent electrode layer may be formed, for example, using a transparent material having a relatively low work function, or for example, may be formed using a suitable material of the materials used to form the hole injection electrode layer, but the present application is not limited thereto. The electron injection electrode layer may also be formed using, for example, deposition or sputtering, or may be suitably patterned when necessary. The electron injection electrode layer may be formed to a suitable thickness as needed.

When the electrode layer is formed, the scattering layer or the scattering layer and the planarized layer (hereinafter, referred to as a scattering layer) may have a smaller projected area than that of the electrode layer. In this case, the scattering layer may have a smaller projected area than that of the base layer. The term "projected area" used herein refers to an area of projecting a target recognized when the substrate is observed from above or below in a direction parallel to a normal line of a surface of the substrate, for example, an area of the base layer, the scattering layer or the electrode layer. Accordingly, for example, although a substantial surface area is larger than that of the base layer because a surface of the scattering layer is formed in an uneven shape, when an area recognized by observing the scattering layer from above is smaller than that recognized by observing the electrode layer from above, it is construed that the scattering layer has a smaller projected area than that of the electrode layer.

The scattering layer may be present in various types when it has a smaller projected area than those of the base layer and the electrode layer. For example, the as shown in FIG. 4 or 5, the scattering layer 102 or the scattering layer 102 and the planarized layer 301 may be formed only at a part of the base layer 101 other than an edge thereof, or a part of the scattering layer may remain at the edge of the base layer.

FIG. 6 is a diagram of the substrate of FIG. 4 when observed from above. As shown in FIG. 6, an area (A), that is, a projected area (A), of the electrode layer 501 recognized when the substrate is observed from above is larger than an area (B), that is, a projected area (B) of the scattering layer 102 laying below. A ratio (A/B) of the projected area (A) of the electrode layer 501 and the area (B) or the projected area (B) of the scattering layer 102 may be, for example, 1.04, 1.06, 1.08, 1.1, or 1.15 or more. When the projected area of the scattering layer is smaller than that of the electrode layer, since an optical functional layer to be described later is possibly embodied not to be exposed to an external environment, the upper limit of the ratio (A/B) in projected area is not particularly limited. In consideration of an environment of manufacturing a general substrate, the upper limit of the ratio (A/B) may be, for example, approximately 2.0, 1.5, 1.4, 1.3 or 1.25. In the substrate, the electrode layer may be formed on the top of the base layer on which the scattering layer is not formed. The electrode layer may be formed in contact with the base layer, or an additional component may be further included between the electrode layer and the base layer. According to such a structure, in the embodiment of the OED, a structure in which the scattering layer is not exposed to an external environment may be embodied.

For example, as shown in FIG. 6, the electrode layer 501 may be formed in a region including a region beyond all of peripheral regions of the scattering layer 102 when observed from above. In this case, for example, when a plurality of scattering layers are present on the base layer, the electrode layer may be formed up to the region including the region beyond all of the peripheral regions of at least one scattering layer, for example, the scattering layer on which an organic layer will be formed at least the top thereof. In such a structure, a structure in which the scattering layer is not exposed to an external environment may be formed by attaching an encapsulating structure to be described layer to an electrode layer below which the scattering layer is not formed. Accordingly, penetration of external moisture or oxygen through the optical functional layer may be prevented, an adhesive strength between an encapsulating structure or an electrode and the substrate may be stably ensured, and a surface hardness at the edge of the device may be excellently maintained. To seal the scattering layer with an electrode and the substrate, an electrode is formed to cover the scattering layer in a deposition or sputtering process for forming an electrode. In this process, when necessary, a process of removing a predetermined part of the scattering layer may be performed.

The substrate may further include, for example, an intermediate layer present between the scattering layer and the electrode layer. When the planarized layer is present, the intermediate layer may be present between the planarized layer and the electrode layer. For example, the intermediate layer may have a larger projected area than that of the scattering layer, and may be formed on the top of the scattering layer and the top of the base layer which does not have the scattering layer. The intermediate layer may solve an increase in resistance of the electrode layer by reducing a step difference on the boundary between the electrode layer on the scattering layer and the electrode layer on the base layer, which is formed by the scattering layer having a smaller projected area than that of the electrode layer as described above. In addition, as the intermediate layer, when a barrier layer, that is, a layer formed of a material having a low penetrating rate of moisture or vapor is used, a structure in which the scattering layer is not exposed to an external environment may be more effectively embodied. The intermediate layer may be a layer having an absolute value of a difference in refractive index between the intermediate layer and the electrode layer of, for example, approximately 1, 0.7, 0.5, or 0.3 or less. When the refractive index is controlled, for example, degradation of light extraction efficiency may be prevented by trapping light generated on the top of the electrode layer at an interface between the electrode layer and the intermediate layer. A material for forming the intermediate layer may be a material having a relationship of the refractive index with the electrode layer, and a barrier ability when necessary. As such a material, various materials, for example, titanium oxide (TiOx) such as SiON or $TiO_2$, silicon oxide (SiOx) such as $SiO_2$, aluminum oxide (AlOx) such as $Al_2O_3$, another metal oxide such as $Ta_2O_5$, $Ti_3O_5$, TiO, $ZrO_2$, $Nb_2O_5$, $CeO_2$, ZnS or ZnO or oxynitride may be used. The intermediate layer may be formed by a known method such as deposition, sputtering or wet coating. A thickness of the intermediate layer may be, but is not particularly limited to, for example, approximately 1 to 100, 10 to 100 or 20 to 80 nm. The thickness means an average thickness, and for example, the intermediate layer formed on the scattering layer and the intermediate layer formed on the base layer may have different thicknesses.

Another aspect of the present application provides an OED. The illustrative OED may include the substrate for an OED and an OED formed on a planarized layer of the substrate. In one embodiment, the OED may be an OLED. When the OED is an OLED, the OED may have, for example, a structure in which an organic layer including at least an emitting layer is intermediated between a hole injection electrode layer and an electron injection electrode layer. The hole injection electrode layer or the electron injection electrode layer may be an electrode layer on the planarized layer of the substrate described above.

In the OLED, the organic layer present between the electron and hole injection electrode layers may include at least one emitting layer. The organic layer may include multiple, that is, at least two emitting layers. When the at least two emitting layers are included, the emitting layers may have a structure split by an inter-electrode having a charge generating characteristic or a charge generating layer (CGL), but the present application is not limited thereto.

The emitting layer may be formed using, for example, various fluorescent or phosphorescent organic materials known in the art. An example of the material capable of being in the emitting layer may be, but is not limited to, a fluorescent material such as an Alq-based material such as tris(4-methyl-8-quinolinolate)aluminum(III) (Alg3), 4-MAlq3 or Gaq3; a cyclopenadiene derivative such as C-545T($C_{26}H_{26}N_2O_2S$), DSA-amine, TBSA, BTP, PAPNPA, spiro-FPA, $Ph_3Si$ (PhTDAOXD), 1,2,3,4,5-pentaphenyl-1,3-cyclopentadiene (PPCP), 4,4'-bis(2,2'-diphenylyinyl)-1,1'-biphenyl (DPVBi), distyryl benzene or a derivative thereof, or 4-(dicyanomethylene)-2-tert-butyl-6-(1,1,7,7,-tetramethyljulolidyl-9-enyl)-4H-pyran (DCJTB), DDP, AAAP or NPAMLI; or a phosphorescent material such as Firpic, m-Firpic, N-Firpic, $bon_2Ir(acac)$, $(C_6)_2Ir(acac)$, $bt_2Ir(acac)$, $dp_2Ir(acac)$, $bzq_2Ir(acac)$, $bo_2Ir(acac)$, $F_2Ir(bpy)$, $F_2Ir(acac)$, $op_2Ir(acac)$, $ppy_2Ir(acac)$, $tpy_2Ir(acac)$, fac-tris[2-(4,5'-difluorophenyl)pyridine-C'2,N] iridium(III) (FIrppy) or bis(2-(2'-benzo[4,5-a]thienyl)pyridinato-N,C3')iridium(acetylactonate) ($Btp_2Ir(acac)$). The emitting layer may include the material as a host, and a host-dopant system including perylene, distyrylbiphenyl, DPT, quinacridone, rubrene, BTX, ABTX or DCJTB as a dopant.

The emitting layer may also be formed by employing one suitable type selected from electron accepting organic compounds and electron donating organic compounds exhibiting excellent emitting characteristics, which will be described later.

The organic layer may be formed in various structures further including various functional layers known in the art, as long as it includes the emitting layer. As a layer capable of being included in the organic layer, an electron injection layer, a hole blocking layer, an electron transport layer, a hole transport layer or a hole injection layer may be used.

The electron injection layer or electron transport layer may be formed using, for example, an electron accepting organic compound. Here, as the electron accepting organic compound, a known optional compound may be used without particular limitation. As such an organic compound, a polycyclic compound such as p-terphenyl or quaterphenyl or a derivative thereof; a polycyclic hydrocarbon compound such as naphthalene, tetracene, pyrene, coronene, chrysene, anthracene, diphenylanthracene, naphthacene, or phenanthrene or a derivative thereof; or a heterocyclic compound such as phenanthroline, bathophenanthroline, phenanthridine, acridine, quinoline, quinoxaline, or phenazine or a derivative thereof. In addition, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene or a derivative thereof, a metal chelate complex compound disclosed in the patent publication such as Japanese Patent Application Laid-Open No. 1988-295695, Japanese Patent Application Laid-Open No. 1996-22557, Japanese Patent Application Laid-Open No. 1996-81472, Japanese Patent Application Laid-Open No. 1993-009470 or Japanese Patent Application Laid-Open No. 1993-017764, for example, a metal complex having at least one of metal chelated oxinoid compounds such as 8-quinolatos including tris(8-quinolinolato)aluminum, bis(8-quinolinolato)magnesium, bis[benzo (f)-8-quinolinolato]zinc, bis (2-methyl-8-quinolinolato)aluminum, tris(8-quinolinolato) indium, tris(5-methyl-8-quinolinolato)aluminum, 8-quinolinolatolithium, tris(5-chloro-8-quinolinolato)gallium, bis(5-chloro-8-quinolinolato)calcium and derivatives thereof as a coordinator; an oxadiazole compound disclosed in the patent publication such as Japanese Patent Application Laid-Open No. 1993-202011, Japanese Patent Application Laid-Open No. 1995-179394, Japanese Patent Application Laid-Open No. 1995-278124 or Japanese Patent Application Laid-Open No. 1995-228579; a triazine compound disclosed in the patent publication such as Japanese Patent Application Laid-Open No. 1995-157473; a stilbene derivative disclosed in the patent publication such as Japanese Patent Application Laid-Open No. 1994-203963; a distyrylarylene derivative; a styryl derivative disclosed in the patent publication such as Japanese Patent Application Laid-Open No. 1994-132080 or Japanese Patent Application Laid-Open No. 1994-88072, a diolefin derivative disclosed in the patent publication such as Japanese Patent Application Laid-Open No. 1994-100857 or Japanese Patent Application Laid-Open No. 1994-207170; a fluorescent brightening agent such as a benzooxazole compound, a benzothiazole compound or a benzoimidazole compound; a distyrylbenzene compound such as 1,4-bis(2-methylstyryl)benzene, 1,4-bis(3-methylstyryl)benzene, 1,4-bis(4-methylstyryl)benzene, distyrylbenzene, 1,4-bis(2- ethylstyryl)benzyl, 1,4-bis(3-ethylstyryl)benzene, 1,4-bis(2-methylstyryl)-2-methylbenzene or 1,4-bis(2-methylstyryl)-2-ethylbenzene; a distyrylpyrazine compound such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine or 2,5-bis[2-(1-pyrenyl)vinyl]pyrazine; a dimethylidine compound such as 1,4-phenylenedimethylidene, 4,4'-phenylenedimethylidene, 2,5-xylene dimethylidene, 2,6-naphthylenedimethylidene, 1,4-biphenylenedimethylidene, 1,4-para-terephenylene dimethylidene, 9,10-anthracenediyldimethylidine, or 4,4'-(2,2-di-tibutylphenylvinyl)biphenyl, 4,4'-(2,2-diphenylvinyl) biphenyl or a derivative thereof; a silanamine derivative disclosed in the patent publication such as Japanese Patent Application Laid-Open No. 1994-49079 or Japanese Patent Application Laid-Open No. 1994-293778; a multifunctional styryl compound disclosed in the patent publication such as Japanese Patent Application Laid-Open No. 1994-279322 or Japanese Patent Application Laid-Open No. 1994-279323; an oxadiazole derivative disclosed in the patent publication such as Japanese Patent Application Laid-Open No. 1994-107648 or Japanese Patent Application Laid-Open No. 1994-092947; an anthracene compound disclosed in the patent publication such as Japanese Patent Application Laid-Open No. 1994-206865; an oxinate derivative disclosed in the patent publication such as Japanese Patent Application Laid-Open No. 1994-145146; a tetraphenyl butadiene compound disclosed in the patent publication such as Japanese Patent Application Laid-Open No. 1992-96990; an organic trifunctional compound disclosed in the patent publication such as Japanese Patent Application Laid-Open No. 1991-296595; a coumarin derivative disclosed in the patent publication such as Japanese Patent Application Laid-Open No. 1990-191694; a perylene derivative disclosed in the patent publication such as Japanese Patent Application Laid-Open No. 1990-196885; a naphthalene derivative disclosed in the patent publication such as Japanese Patent Application Laid-Open No. 1990-255789; a phthaloperynone derivative disclosed in the patent publication such as Japanese Patent Application Laid-Open No. 1990-289676 or Japanese Patent Application Laid-Open No. 1990-88689; or a styryl amine derivative disclosed in the patent publication such as Japanese Patent Application Laid-Open No. 1990-250292 may be used as an electron accepting organic compound included in a lowly refractive layer. In addition, here, the electron injection layer may be formed using, for example, a material such as LiF or CsF.

The hole blocking layer may be a layer capable of enhancing a life span and efficiency of the device by preventing approach of holes injected from a hole injection electrode to an electron injection electrode through the emitting layer, and may be formed in a suitable part between the emitting layer and the electron injection electrode using a known material when necessary.

The hole injection layer or hole transport layer may include, for example, an electron donating organic compound. As the electron donating organic compound, N,N',N'-tetraphenyl-4,4'-diaminophenyl, N,N'-diphenyl-N,N'-di(3-methylphenyl)-4,4'-diaminobiphenyl, 2,2-bis(4-di-p-tollylaminophenyl)propane, N,N,N',N'-tetra-p-tollyl-4,4'-diaminobiphenyl, bis(4-di-p-tollylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quadriphenyl, 4-N,N-diphenylamino-(2-diphenylvinyl)benzene, 3-methoxy-4'-N,N-diphenylaminostyrylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tollyl)amine, 4-(di-p-tollylamino)-4'-[4-(di-p-tollylamino)styryl]stilbene, N,N,N',N'-tetraphenyl-4,4'-diaminobiphenyl N-phenylcarbazole, 4,4'-bis[N-(1-naphthyl)-N-phenyl-amino]biphenyl, 4,4''-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4''-bis[N-(1-anthryl)-N-phenylamino]-p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tollylamino)naphthalene, 2,6-bis[di-(1-naphthyl)amino]naphthalene, 2,6-bis[N-(1-naphthyl)-N-(2-naphthyl)amino]naphthalene, 4,4''-bis[N,N-di(2-naphthyl)amino]terphenyl, 4,4'-bis{N-phenyl-N-[4-(1-naphthyl)phenyl]amino}biphenyl, 4,4'-bis[N-phenyl-N-(2-pyrenyl)amino]biphenyl, 2,6-bis[N,N-di-(2-naphthyl)amino]fluorine or 4,4'-bis(N,N-di-p-tollylamino)terphenyl, or an aryl amine compound such as bis(N-1-naphthyl)(N-2-naphthyl)amine may be used, but the present application is not limited thereto.

The hole injection layer or hole transport layer may be formed by dispersing the organic compound in a polymer, or using a polymer derived from the organic compound. In addition, a π-conjugated polymer such as polyparaphenylenevinylene and a derivative thereof, a hole transport non-conjugated polymer such as poly(N-vinylcarbazole) or a σ-conjugated polymer of polysilane may also be used.

The hole injection layer may be formed using an electrically-conductive polymer such as a metal phthalocyanine such as copper phthalocyanine or a non-metal phthalocyanine, a carbon layer and polyaniline, or may be formed by reaction with a Lewis acid using the aryl amine compound as an oxidizing agent.

For example, the OLED may be formed in a type of (1) a hole injection electrode layer/an organic emitting layer/an electron injection electrode layer; (2) a hole injection electrode layer/a hole injection layer/an organic emitting layer/an electron injection electrode layer; (3) a hole injection electrode layer/an organic emitting layer/an electron injection layer/an electron injection electrode layer; (4) a hole injection electrode layer/a hole injection layer/an organic emitting layer/an electron injection layer/an electron injection electrode layer; (5) a hole injection electrode layer/an organic semiconductor layer/an organic emitting layer/an electron injection electrode layer; (6) a hole injection electrode layer/an organic semiconductor layer/an electron barrier layer/an organic emitting layer/an electron injection electrode layer; (7) a hole injection electrode layer/an organic semiconductor layer/an organic emitting layer/an adhesion-improving layer/an electron injection electrode layer; (8) a hole injection electrode layer/a hole injection layer/a hole transport layer/an organic emitting layer/an electron injection layer/an electron injection electrode layer; (9) a hole injection electrode layer/an insulating layer/an organic emitting layer/an insulating layer/an electron injection electrode layer; (10) a hole injection electrode layer/an inorganic semiconductor layer/an insulating layer/an organic emitting layer/an insulating layer/an electron injection electrode layer; (11) a hole injection electrode layer/an organic semiconductor layer/an insulating layer/an organic emitting layer/an insulating layer/an electron injection electrode layer; (12) a hole injection electrode layer/an insulating layer/a hole injection layer/a hole transport layer/an organic emitting layer/an insulating layer/an electron injection electrode layer or (13) a hole injection electrode layer/an insulating layer/a hole injection layer/a hole transport layer/an organic emitting layer/an electron injection layer/an electron injection electrode layer, which are sequentially formed from the planarized layer of the substrate, and in some cases, the OLED may have an organic layer having a structure in which at least two emitting layers are split by an inter-electrode layer having a charge generating characteristic or CGL between a hole injection electrode layer and an electron injection electrode layer, but the present application is not limited thereto.

Various materials for forming a hole or electron injection electrode layer and an organic layer, for example, an emitting layer, an electron injection or transport layer, or a hole injection or transport layer and methods of forming the same are known in the art, and all of the above-described methods may be applied to manufacture the OED.

The OED may further include an encapsulating structure. The encapsulating structure may be a protective structure for preventing inflow of an external material such as moisture or oxygen to the organic layer of the OED. The encapsulating structure may be, for example, a can such as a glass can or metal can, or a film covering an entire surface of the organic layer.

For example, the encapsulating structure such as a glass or metal can may be attached to the substrate, for example, by an adhesive. The encapsulating structure may be adhered to the substrate, for example, an electrode layer below which a scattering layer is not present. For example, the encapsulating structure may be attached to an end of the substrate by an adhesive. According to such a method, a protecting effect by the encapsulating structure may be optimized.

The encapsulating structure may be, for example, a film coating entire surfaces of an organic layer and a second electrode layer. For example, the film-type encapsulating structure may cover the entire surfaces of the organic layer and the second electrode layer, and have a structure in which the substrate including the base layer, the scattering layer and the electrode layer is adhered to a second substrate laying above. For example, as the second substrate, a glass substrate, a metal substrate, a polymer film or a barrier layer may be used. The film-type encapsulating structure may be formed by, for example, coating a liquid material cured by heat or UV irradiation such as an epoxy resin and curing the liquid material, or laminating the substrate with the upper substrate using an adhesive sheet previously manufactured in a film type using the epoxy resin.

The encapsulating structure may include a water adsorbent or getter such as a metal oxide such as calcium oxide or beryllium oxide, a metal halide such as calcium oxide, or phosphorus pentoxide, when necessary. For example, the water adsorbent or getter may be included in the film-type encapsulating structure, or present at a predetermined position of a can-type encapsulating structure. The encapsulating structure may further include a barrier film or a conductive film.

The encapsulating structure may be attached to, for example, the top of the first electrode layer below which the scattering layer is not formed. Accordingly, a sealing structure in which the scattering layer is not exposed to an external environment may be embodied. The sealing structure may refer to, for example, a state in which the entire surface of the scattering layer is not exposed to an external environment by being surrounded by the base layer, the electrode layer and/or the encapsulating structure, or by being surrounded by the sealing structure formed to include the base layer, the electrode layer and/or the encapsulating structure. The sealing structure may be formed to only include the base layer, the electrode layer and/or the encapsulating structure, or to include the base layer, the electrode layer, the encapsulating structure, and also another component, for example, an auxiliary electrode as long as the scattering layer is not exposed to an external environment.

Still another aspect of the present application provides a use of the OED, for example, the OLED. The OLED may be effectively applied to a backlight of a liquid crystal display (LCD), lightings, sensors, printers, a light source of a copy machine, a light source for an automobile gauge, a signal light, a pilot lamp, a display device, a light source for a planar emitting device, a display, decoration or other kinds of lights. In one embodiment, the present application relates to a lighting device including the OLED. When the OLED is applied to the lighting device or for different uses, other components constituting the device or a method of constituting the device is not particularly limited, but all of optional materials or methods known in the related art may be employed as long as these are used in the OLED.

Effect

According to the present application, a substrate capable of forming an OED can have excellent performances including light extraction efficiency and prevent penetration of moisture or a gas from an external environment, and thus an OED having excellent performance and durability can be provided.

Figure 1:
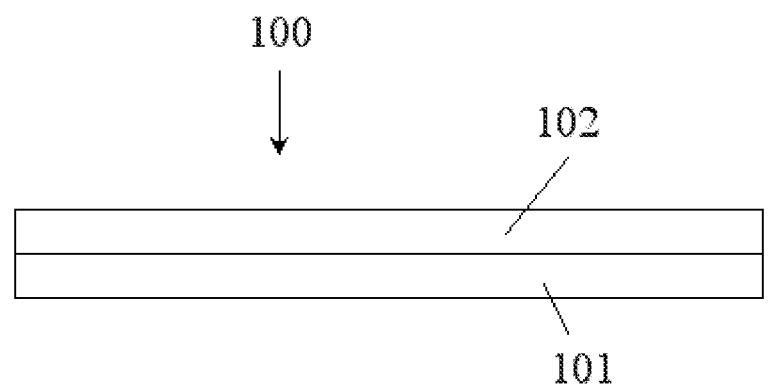
FIG. 1 shows a schematic of an illustrative embodiment of the substrate.
Figure 2:
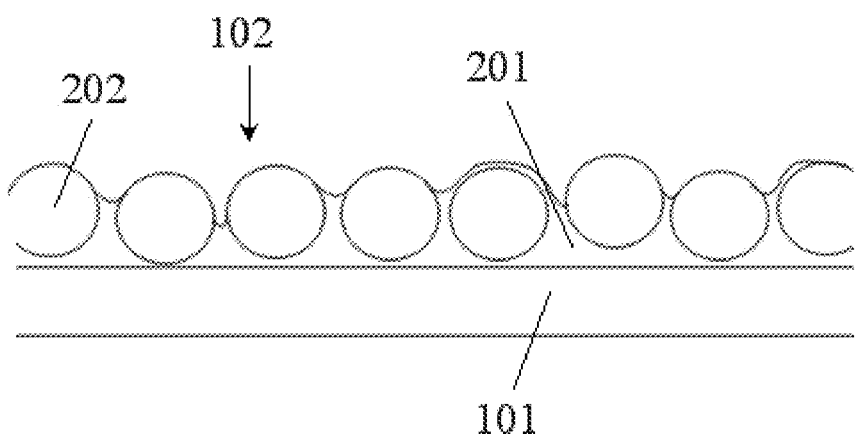
FIG. 2 shows a schematic of an illustrative embodiment of a cross-sectional view of the scattering layer.
Figure 3:
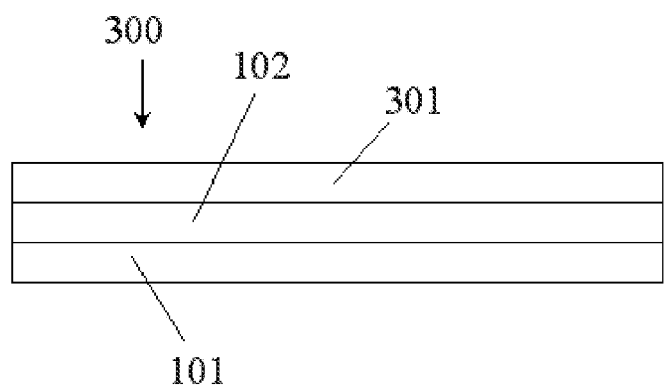
FIGS. 3 to 6 show schematics of illustrative embodiments of the substrates.
Figure 4:
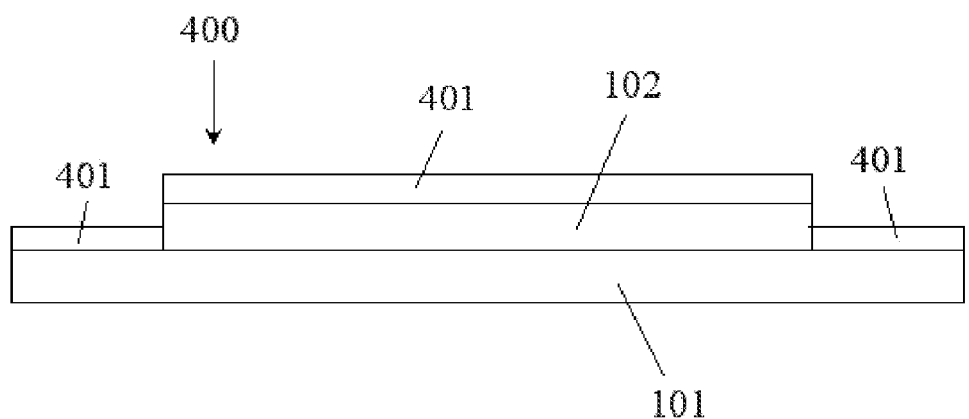
Figure 5:
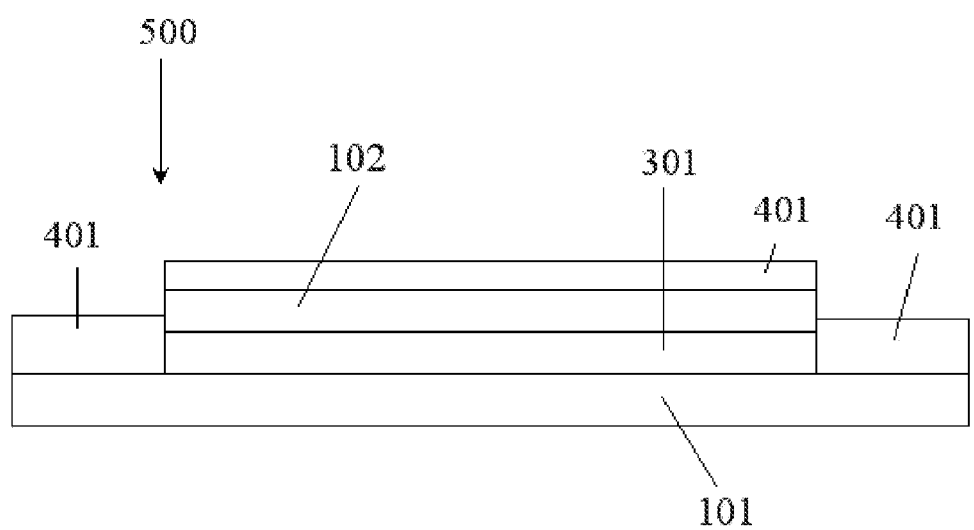
Figure 6:
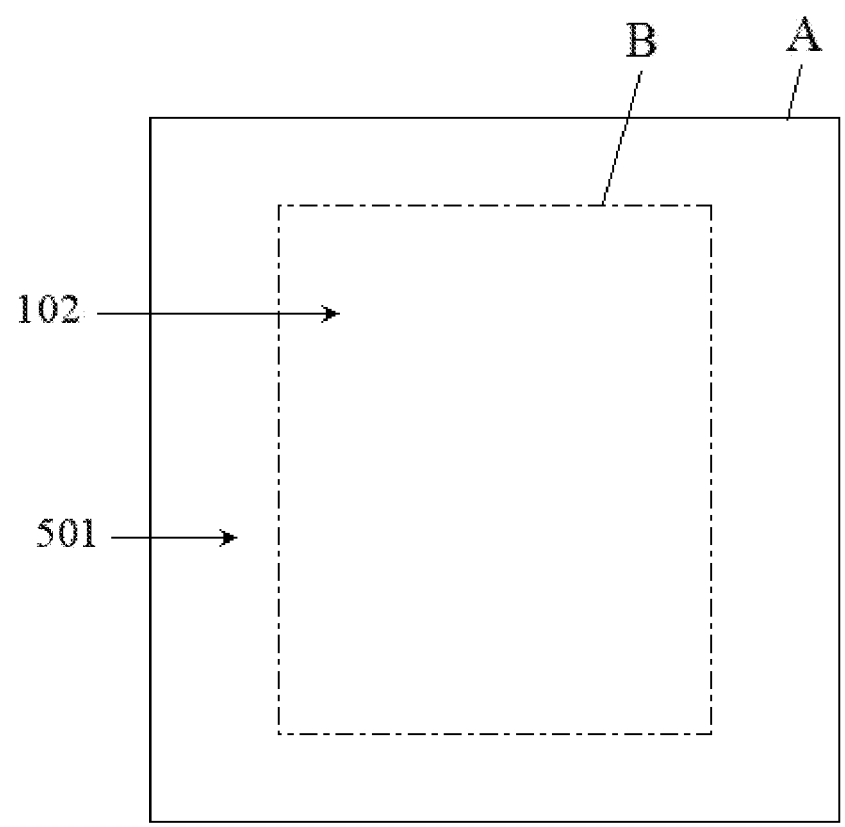

DESCRIPTION OF THE MARKS 100, 300, 400, 500: the substrate for OED
101: the base layer
102: the scattering layer
201: the binder
202: the scattering particle
301: the scattering layer
401, 501: the electrode layer

ILLUSTRATIVE EMBODIMENTS

Hereinafter, illustrative embodiments of the present application will be described in detail. However, the present application is not limited to the embodiments disclosed below.

Example 1

Figure 7:
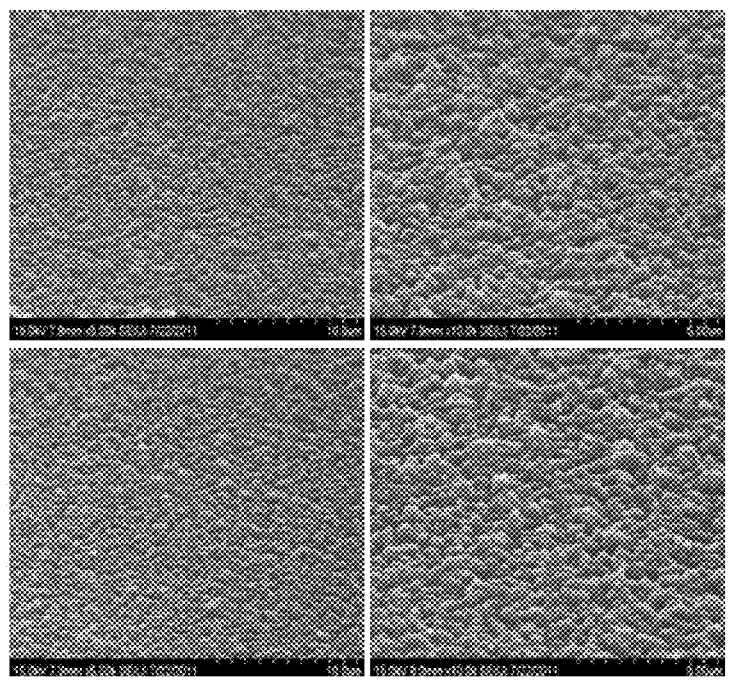
FIGS. 7 to 9 are FE-SEM images of a scattering layer according to Example 1.
Figure 8:
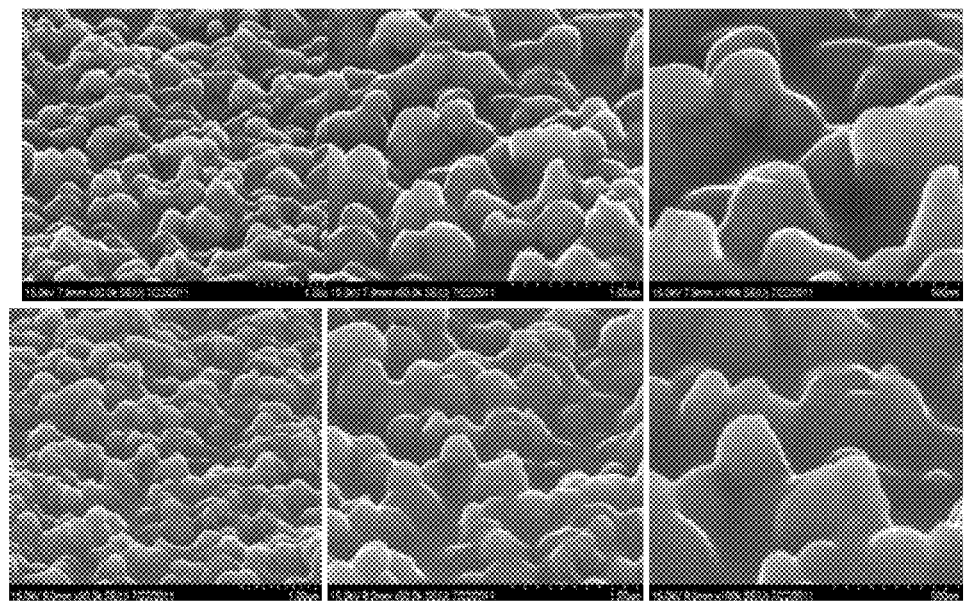
Figure 9:
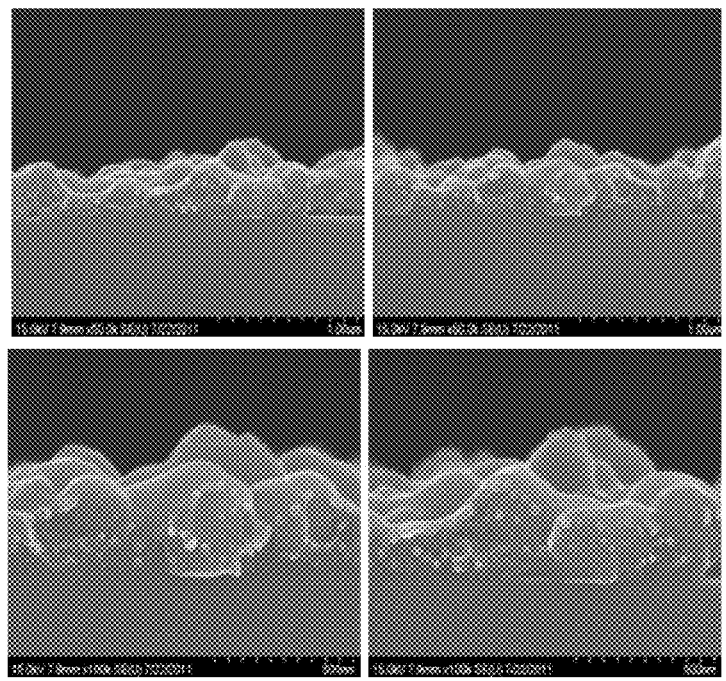
Figure 10:
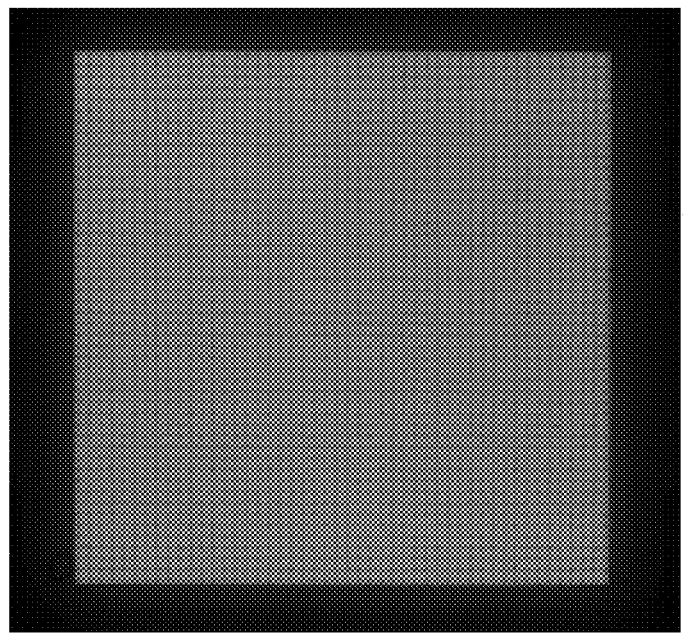
FIG. 10 is a diagram showing an emitting state of an OED manufactured in Example.

A scattering layer was formed by coating a coating solution prepared by blending poly(amic acid) synthesized using a compound of Formula A (3,3'-sulfonyldianiline) and a compound of Formula B (3,3',4,4'-biphenyltetracarboxylic dianhydride) by a known method of synthesizing poly(amic aicd), which has refractive index of approximately 1.7 to 1.8, and a weight average molecular weight (Mw) of approximately 30,000 with scattering particles (titanium oxide particles having an average diameter of approximately 200 nm and a refractive index of approximately 2.2 to 2.7) in a ratio of 1:2 (poly(amic acid):scattering particles) on a glass base. FIGS. 7 to 9 are FE-SEM images of the scattering layer formed as described above. Afterward, a planarized layer was formed by coating a highly refractive coating solution (weight ratio of the binder to the titanium oxide particles: 4:6) prepared by blending a sol-gel coating solution including a tetramethoxy silane binder with rutile-type highly refractive titanium oxide particles having an average diameter of approximately 10 nm and a refractive index of approximately 2.6 on the top of the scattering layer, and performing a sol-gel reaction under the same condition used above. Subsequently, the scattering layer and the planarized layer were partially removed by irradiating a laser to the layer formed above to correspond positions of the remaining scattering layer and the planarized layer to an emitting region of an organic layer which will be subsequently formed. After the removal of the planarized layer, a hole injection electrode layer including ITO was formed on an entire surface of the glass substrate to have a predetermined thickness by a known sputtering method. Subsequently, a device was manufactured by forming an organic layer capable of emitting white light on the ITO layer using known materials and method, and forming an aluminum (Al) electrode as an electron injection reflective electrode on the top of the organic layer by a vacuum deposition method. FIG. 10 is a diagram showing an emitting state of the device manufactured above. In addition, external quantum efficiency (light extraction efficiency) measured with respect to the manufactured device was approximately 54%.

Comparative Example 1

A device was manufactured as described in Example 1, except that a scattering layer and a planarized layer were not formed. External quantum efficiency (light extraction efficiency) measured with respect to the manufactured device by the same method as in Example 1 was approximately 28%.

What is claimed is:

1. A substrate for an organic electronic device, comprising:

a base layer; and a scattering layer that is on the base layer and that comprises a binder comprising poly(amic acid) and a scattering particle, of which a refractive index is different from that of the binder, wherein the difference in refractive index between the scattering particle and the binder is from 0.5 to 4.0, wherein the scattering particle has a refractive index of 2.1 to 3.5 and the binder has a refractive index of 1.7 or more with respect to light having a wavelength of 633 nm, wherein the scattering particle forms a single layer in the scattering layer, and wherein the poly(amic acid) has a light transmittance of 80% or more in a visible region.

2. The substrate according to claim 1, wherein the poly(amic acid) has a refractive index of 1.8 or more with respect to light having a wavelength of 633 nm.

3. The substrate according to claim 1, wherein the poly(amic acid) comprises a repeating unit of Formula 1:

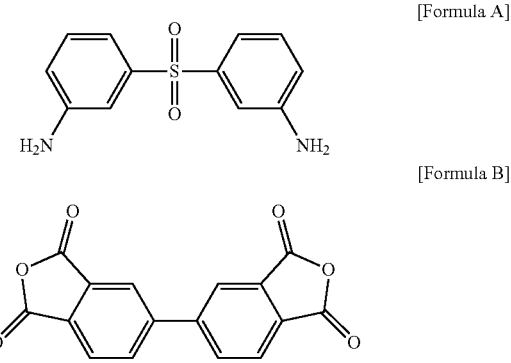

[Formula A]

[Formula B]

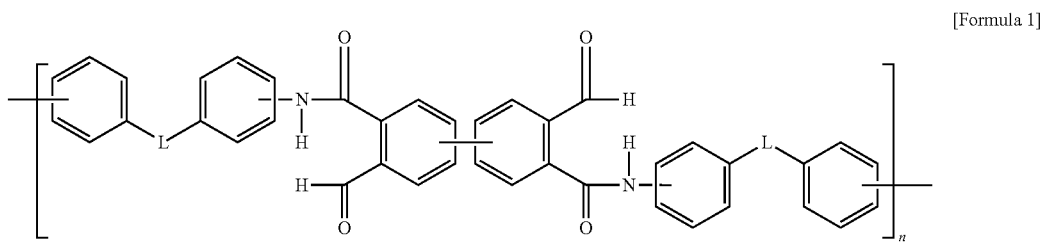

[Formula 1]

where L is —S—, —S(=O)—, —S(=O)$_2$— or —S—S—, and n is a positive number.

4. The substrate according to claim 1, wherein the poly(amic acid) comprises a repeating unit of Formula 2:

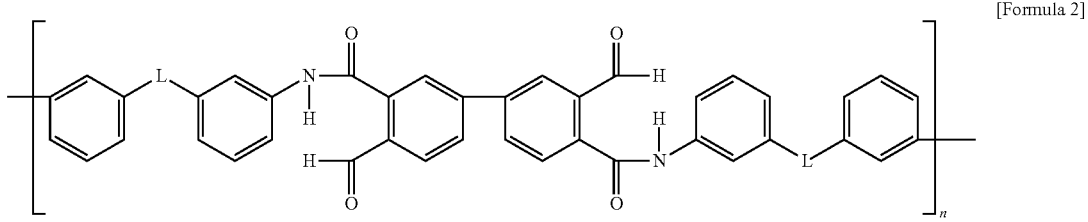

[Formula 2]

where L is —S—, —S(=O)—, —S(=O)$_2$— or —S—S—, and n is a positive number.

5. The substrate according to claim 1, wherein the poly(amic acid) has a weight average molecular weight converted based on the standard polystyrene measured by gel permeation chromatograph in the range from 10,000 to 100,000.

6. The substrate according to claim 1, wherein the binder comprises the poly(amic acid) and further comprises polyimide.

7. The substrate according to claim 1, wherein the scattering particle has an average diameter of 100 nm or more.

8. The substrate according to claim 1, further comprising: a planarized layer on the scattering layer.

9. The substrate according to claim 8, wherein the planarized layer comprises a polysiloxane, polyimide or poly(amic acid) binder and a particle, of which a refractive index is 2.5 or more.

10. The substrate according to claim 9, wherein the planarized layer comprises the particle, of which a refractive index is 2.5 or more in an amount of 300 parts by weight or less relative to 100 parts by weight of the binder.

11. The substrate according to claim 1, further comprising: an electrode layer formed on the scattering layer.

12. The substrate according to claim 11, wherein a projected area of a high refractive layer is smaller than that of the electrode layer, and the electrode layer is formed on both of the high refractive layer and the base layer on which the high refractive layer is not formed.

13. An organic electronic device, comprising:
a substrate; and
a first electrode layer; an organic layer comprising an emitting layer; and a second electrode layer, which are sequentially present on the substrate,
wherein the substrate comprises a base layer; and a scattering layer that is on the base layer and that comprises a binder comprising poly(amic acid) or polyimide and a scattering particle, of which a refractive index is different from that of the binder, wherein the difference in refractive index between the scattering particle and the binder is from 0.5 to 4.0, wherein the scattering particle has a refractive index of 2.1 to 3.5 and the binder has a refractive index of 1.7 or more with respect to light having a wavelength of 633 nm, and wherein the scattering particle forms a single layer in the scattering layer.

14. The organic electronic device according to claim 13, which is an organic light emitting device.

15. Lighting, comprising: the organic electronic device of claim 13.

* * * * *